United States Patent
Imoto et al.

(10) Patent No.: US 7,202,563 B2
(45) Date of Patent: Apr. 10, 2007

(54) SEMICONDUCTOR DEVICE PACKAGE HAVING A SEMICONDUCTOR ELEMENT WITH RESIN

(75) Inventors: Takashi Imoto, Yokohama (JP); Chiaki Takubo, Tokyo (JP); Ryuji Hosokawa, Ebina (JP); Yoshihisa Imori, Yokohama (JP); Takao Sato, Tokyo (JP); Tetsuya Kurosawa, Yokohama (JP); Mika Kiritani, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 11/088,879

(22) Filed: Mar. 25, 2005

(65) Prior Publication Data

US 2005/0212145 A1 Sep. 29, 2005

(30) Foreign Application Priority Data

Mar. 25, 2004 (JP) ............... 2004-089476

(51) Int. Cl.
*H01L 23/34* (2006.01)
*H01L 23/31* (2006.01)

(52) U.S. Cl. ............... 257/724; 257/787; 257/E23.127
(58) Field of Classification Search ............... None
See application file for complete search history.

(56) References Cited

U.S. PATENT DOCUMENTS

| | | | |
|---|---|---|---|
| 5,527,741 A * | 6/1996 | Cole et al. ............... 438/107 |
| 5,633,785 A * | 5/1997 | Parker et al. ............... 361/766 |
| 6,239,482 B1 * | 5/2001 | Fillion et al. ............... 257/678 |
| 6,389,689 B2 * | 5/2002 | Heo ............... 29/840 |
| 6,423,622 B1 * | 7/2002 | Chen et al. ............... 438/598 |
| 6,650,010 B2 | 11/2003 | Davis et al. |
| 6,717,240 B2 | 4/2004 | Higashi |
| 6,734,090 B2 | 5/2004 | Agarwala et al. |
| 6,998,704 B2 * | 2/2006 | Yamazaki et al. ............... 257/688 |
| 7,064,412 B2 * | 6/2006 | Geissinger et al. ............... 257/535 |

FOREIGN PATENT DOCUMENTS

| JP | 7-135203 | 5/1995 |
|---|---|---|
| JP | 2000-232100 | 8/2000 |
| JP | 2003-197564 | 7/2003 |

OTHER PUBLICATIONS

Notification of Reasons for Rejection dated Sep. 19, 2006 in Japanese Patent Application No. 2005-086815.

* cited by examiner

*Primary Examiner*—Alonzo Chambliss
(74) *Attorney, Agent, or Firm*—Finnegan, Henderson, Farabow, Garrett & Dunner, L.L.P.

(57) ABSTRACT

A semiconductor device is disclosed, which comprises a semiconductor element in which a laminated film composed of a plurality of layers including an insulating film is formed on a surface of a semiconductor substrate, and a portion of the laminated film is removed from the surface of the semiconductor substrate so that the semiconductor substrate is exposed at the portion, a mounting substrate on which the semiconductor element is mounted, and a resin layer which seals at least a surface side of the semiconductor element with resin.

12 Claims, 7 Drawing Sheets

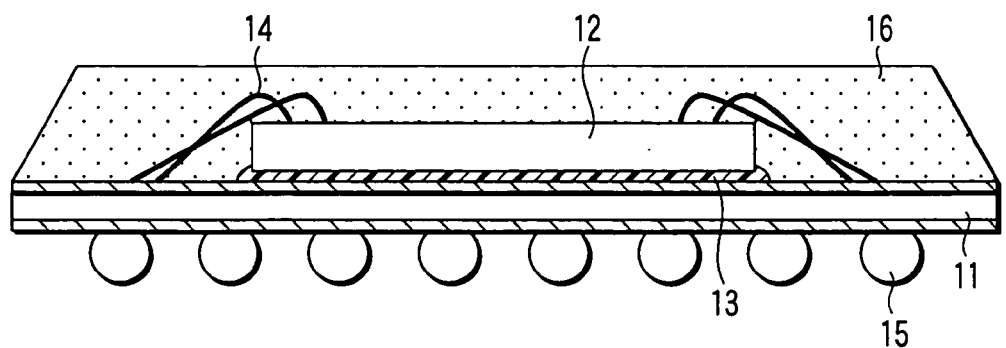
F I G. 1
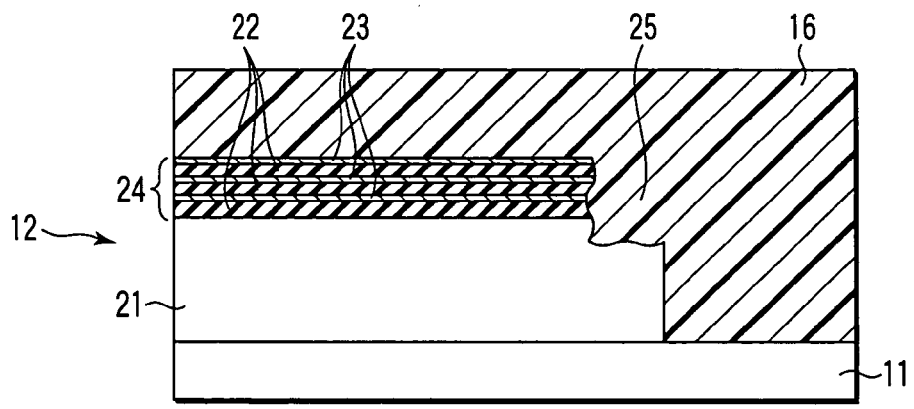
F I G. 2
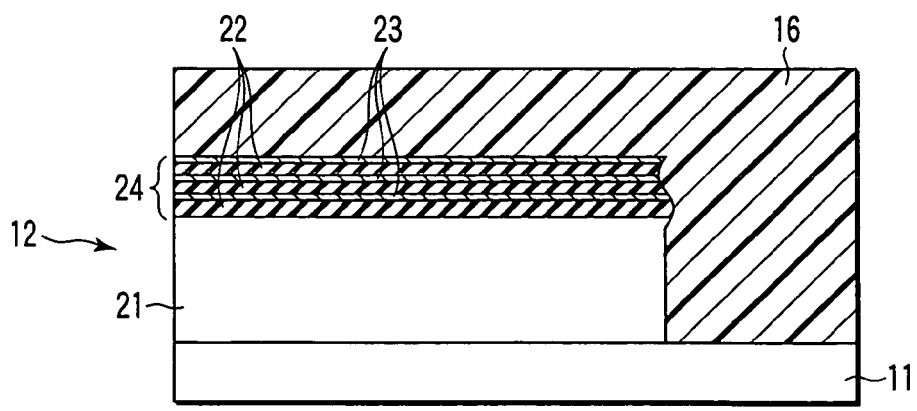
F I G. 3

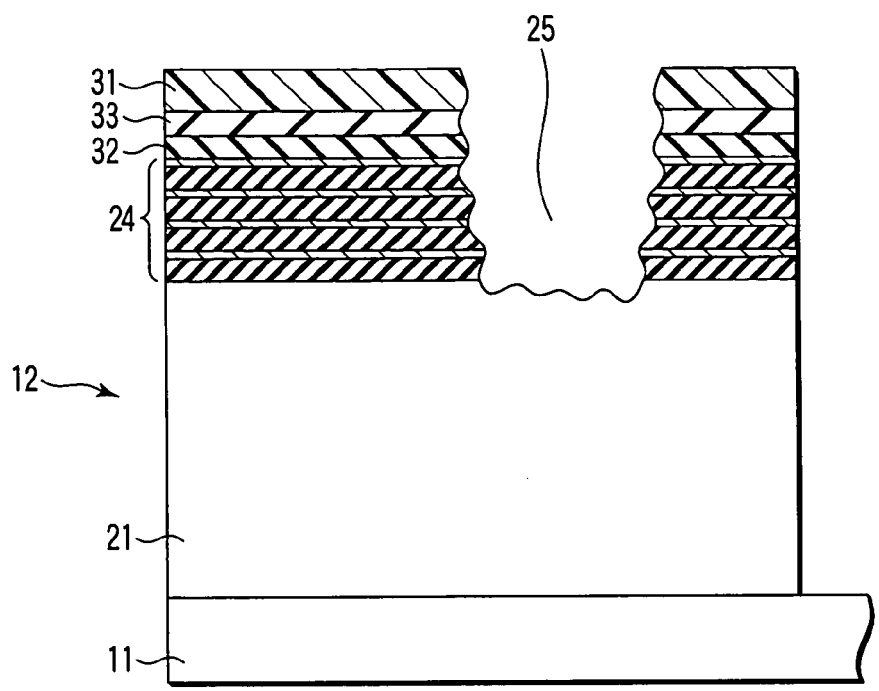
F I G. 14
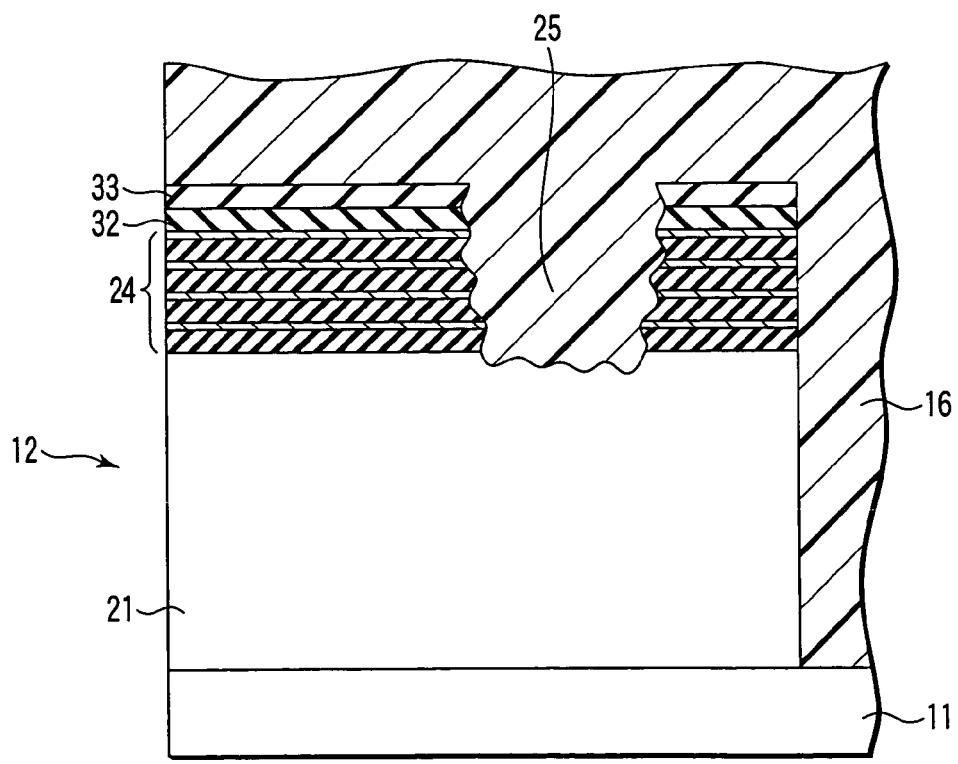
F I G. 15

SEMICONDUCTOR DEVICE PACKAGE HAVING A SEMICONDUCTOR ELEMENT WITH RESIN

CROSS-REFERENCE TO RELATED APPLICATIONS

This application is based upon and claims the benefit of priority from prior Japanese Patent Application No. 2004-089476, filed Mar. 25, 2004, the entire contents of which are incorporated herein by reference.

BACKGROUND OF THE INVENTION

1. Field of the Invention

The present invention relates to packaging technology for semiconductor elements, and more particularly to a semiconductor device packaged by sealing a semiconductor element with resin, and a method of manufacturing the same.

2. Description of the Related Art

In recent years, in order to reduce a delay of a signal due to parasitic capacity between wires in a semiconductor element and a leak current in the element, a low dielectric layer having a dielectric constant of 3 or less has been used as a multi-layer wiring interlayer insulator of the semiconductor element. To achieve a lower dielectric constant of 2 or less, fine air pores of about 0.1 to 100 nm are formed within the dielectric layer to obtain a porous material including a solid portion and air having a smaller dielectric constant. Such a low dielectric film has a low strength in terms of material and is very vulnerable because fine air is contained therein.

On the other hand, the semiconductor element is cut out mechanically from a wafer with a grinding stone, mounted on a glass epoxy substrate or a lead frame made of iron or copper alloy and sealed with epoxy or silicon base resin so as to produce a semiconductor package. Because, at this time, a peripheral portion of the semiconductor element is cut out with the grinding stone, the peripheral end of the element becomes so steep as to be substantially at right angle and a multi-layer insulating layer on the element is exposed outside. The steep side surface of the semiconductor element indicates cleavage in which the crystal orientations of pure silicon are aligned, so that adhesion strength to the sealing resin is low (for example, Jpn. Pat. Appln. KOKAI Publication No. 2003-197564).

When a semiconductor package is formed, stress is applied on the upper surface, side surface and lower surface of the semiconductor element because of differences in thermal expansion coefficient among the sealing resin, the substrate, and the semiconductor element. In the semiconductor package as a structure, higher stress is applied as it leaves toward the periphery from the center, and particularly, a high stress is applied on the peripheral portion of the semiconductor element such as the peripheral end and the side surface of the element. Due to the stress, there is such a problem that peeling occurs within the low dielectric film or on the multi-layer wiring layer interface within the multi-layer wiring film on the surface of the semiconductor element incorporating the low dielectric film. The semiconductor element surface has a higher thermal stress as it goes toward its peripheral end and if the multi-layer insulating film is peeled even slightly, peeling among the inter-layers advances from the portion.

The side surface of the semiconductor element and a portion near a cut section of the semiconductor element cannot obtain a high adhesion strength to the sealing resin as described above. Therefore, the sealing resin on the side surface of the semiconductor element having a high thermal stress is peeled easily, and stress of the surface including multi-layer wiring near the peripheral end of the semiconductor element increases extremely, so that the peeling of the vulnerable low dielectric layer is accelerated, which is another problem.

If a semiconductor package is constructed by sealing a semiconductor element comprising a vulnerable interlayer insulating film having a low dielectric constant according to the conventional method, peeling occurs in the interlayer insulating film having a low dielectric constant due to stress applied to the peripheral portion of the semiconductor element, the reliability of the element is decreased, which is still another problem.

BRIEF SUMMARY OF THE INVENTION

According to an aspect of the present invention, there is provided a semiconductor device comprising:

a semiconductor element in which a laminated film composed of a plurality of layers including an insulating film is formed on a surface of a semiconductor substrate, and a portion of the laminated film is removed from the surface of the semiconductor substrate so that the semiconductor substrate is exposed at the portion;

a mounting substrate on which the semiconductor element is mounted; and a resin layer which seals at least a surface side of the semiconductor element with resin.

According to another aspect of the present invention, there is provided a method of manufacturing a semiconductor device, comprising:

carrying out a reactive ion etching, with regard to a semiconductor element in which a laminated film composed of a plurality of layers including an insulating film is formed on a surface of a semiconductor substrate, to remove a portion of the laminated film from the surface of the semiconductor substrate so that the semiconductor substrate is exposed at the portion;

mounting the semiconductor element on a mounting substrate; and sealing at least a surface side of the semiconductor element with resin.

According to a further aspect of the present invention, there is provided a method of manufacturing a semiconductor device, comprising:

carrying out a laser beam application, with regard to a semiconductor element in which a laminated film composed of a plurality of layers including an insulating film is formed on a surface of a semiconductor substrate, to remove a portion of the laminated film from the surface of the semiconductor substrate so that the semiconductor substrate is exposed at the portion;

mounting the semiconductor element on a mounting substrate; and sealing at least a surface side of the semiconductor element with resin.

BRIEF DESCRIPTION OF THE SEVERAL VIEWS OF THE DRAWING

FIG. 1 is a sectional view showing a schematic structure of a semiconductor device according to a first embodiment of the present invention;

FIG. 2 is an enlarged sectional view showing a peripheral structure of a semiconductor element used in the semiconductor device of FIG. 1;

FIG. 3 is a sectional view showing a schematic structure of a conventional semiconductor element;

FIG. 14 is a sectional view showing a peripheral structure of a semiconductor element processed with laser according to a sixth embodiment of the present invention;

FIG. 15 is a sectional view showing the peripheral structure of the semiconductor element shown in FIG. 14, after the surface protecting film is removed and the structure is sealed by resin;

DETAILED DESCRIPTION OF THE INVENTION

Figure 4:
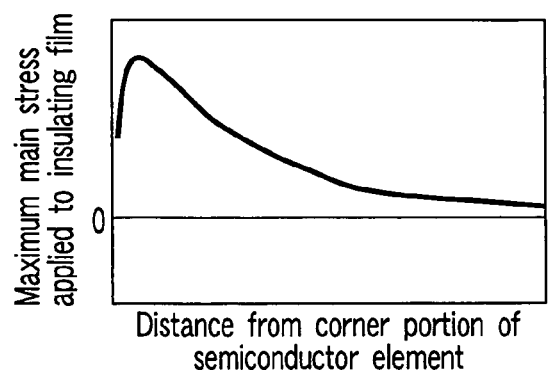
FIG. 4 is a diagram for explaining the conventional example shown in FIG. 3, by plotting the maximum main stress applied to a laminated film depending on a distance from a peripheral end of the conventional semiconductor element.

Hereinafter, embodiments of the present invention will be described with reference to the accompanying drawings.

First Embodiment

FIG. 1 is a sectional view showing a schematic structure of a semiconductor device according to a first embodiment of the present invention.

A semiconductor chip (semiconductor element) 12 is mounted on a mounting substrate 11 with an adhesive agent 13, and electrode pads (not shown) of the semiconductor element 12 are connected to wirings (not shown) on the mounting substrate 11 through bonding wires 14. Solder balls 15 are provided on the bottom surface of the mounting substrate 11. The semiconductor element 12 is sealed with epoxy or silicon base resin 16.

Although the above-mentioned packaged structure, that is, the basic structure of P-BGA package is the same as a conventional one, a peripheral structure of the semiconductor element 12 of this embodiment is different from the conventional package as described below.

FIG. 2 is an enlarged sectional view showing the peripheral structure of the semiconductor element 12 in the present embodiment. To simplify the explanation in FIG. 2, the adhesive agent 13 and the solder balls 15 are omitted.

In the semiconductor element 12, various kinds of interlayer insulating films 22 are formed on a semiconductor substrate 21 and wiring layers 23 are formed between the insulating films 22. At least one of the insulating films 22 is a low dielectric film having a dielectric constant of 2 or less.

A laminated film 24 (22, 23) of the semiconductor element 12 is formed in a wafer state, and the wafer is finally cut out to provide a plurality of semiconductor chips by dicing. According to the embodiment, before or after dicing the wafer to cut out semiconductor elements from the wafer, the laminated film 24 containing the low dielectric layer formed on a dicing line is removed by using non-contact high energy processing such as reactive ion etching (RIE), focus ion beam etching (FIB) and laser beam so as to expose the surface of the silicon wafer or chips. Reference numeral 25 in FIG. 2 indicates a removed portion of the laminated film 24.

With such a structure, the peripheral portion of the semiconductor element 12 is formed in the shape of step, so that an exposed surface of the silicon substrate can be formed at the peripheral portion of the element. The silicon surface has an extremely high adhesiveness to the epoxy-based or silicon-based sealing resin 16 and as a consequence, the resin 16 is not peeled easily from the silicon. At the same time, an area in which no vulnerable low dielectric layer from which peeling originates exists can be secured, and stress applied to the laminated film 24 at the peripheral portion of the semiconductor element is born by the sealing resin 16 bonded to the silicon surface, so that the stress to the end of the vulnerable laminated film can be reduced by an amount corresponding to a distance in which the side surface of the laminated film 24 goes back toward the inside of the element.

By setting a large width from the semiconductor element end as the area from which the laminated film 24 is removed, the peeling stress applied to the low dielectric layer can be reduced. Although a greater effect can be expected as the width of the laminated films 24 to be removed is increased, wafer yield drops as it increases. Thus, when the laminated film 24 is removed, it is effective to remove the laminated film 24 at a peripheral portion having a high thermal stress applied. According to experiments of the inventors of the present invention, it was found to be effective that the width of the laminated films 24 to be removed is from the peripheral end of the semiconductor element to 300 µm. It is more preferable the width is from the peripheral end of the semiconductor element to 5 to 10 μm.

For comparison, an example in which a conventional element is packaged is shown in FIG. 3. The peripheral portion of the semiconductor element 12 is cut vertically, and no surface other than the side surface of the silicon substrate 21 is exposed, so that a contact area between the substrate silicon and the resin layer 16 is small and high adhesion strength can not be obtained.

Figure 5:
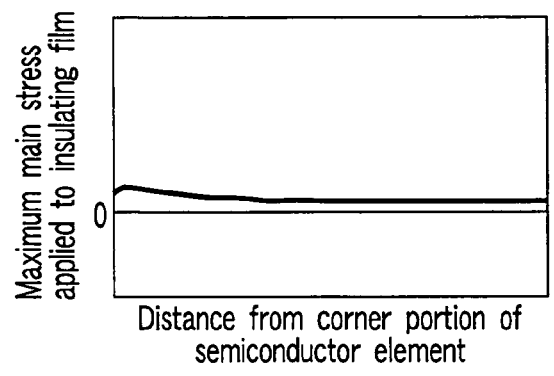
FIG. 5 is a diagram for explaining the first embodiment shown in FIG. 1, by plotting the maximum main stress applied to a laminated film depending on a distance from a peripheral end of the semiconductor element.

FIG. 4 is a diagram for explaining the first embodiment shown in FIG. 3, by plotting the maximum main stress applied to a laminated film depending on a distance from a peripheral end of the conventional semiconductor element, and FIG. 5 is a diagram for explaining the first embodiment shown in FIG. 1, by plotting the maximum main stress applied to a laminated film depending on a distance from a peripheral end of the semiconductor element. As shown in FIG. 4, according to the conventional structure shown in FIG. 3, stress is very large in the vicinity of the peripheral portion of the element, and this leads to a cause of film peeling. Contrary to this, as shown in FIG. 5, according to the structure of the embodiment shown in FIG. 1, stress applied to the laminated film is very small because the laminated film at the peripheral portion of the element including the peripheral end is removed. From this also, it is evident that the embodiment has eliminated the possibility of film peeling at the peripheral portion of the laminated film, thereby making it possible to improve the element reliability.

If RIE is used for removing the laminated film 24 on the semiconductor element 12, the side wall surface including the laminated film 24, and the silicon portion can be finished at a surface roughness of Rmax =1 μm or less. Further, at the peripheral portion of the laminated film 24 as well, no film peeling occurs. Contrary to this, in blade processing using a grinding stone like conventionally, the sidewall surface including the laminated film 24 provides a surface roughness of Rmax=about 10 to 100 μm, the silicon portion provides a surface roughness of Rmax=about 5 μmm, and film peeling occurs at the peripheral portion of the laminated film 24.

From the above fact, the availability of the RIE can be recognized. That is, the effect of this embodiment described above is obtained by carrying out RIE to remove the laminated film, and if the removal of the laminated film 24 at the peripheral portion of the element is carried out by blade processing, the above-described effect cannot be obtained. Further, also in the FIB, the same effect as RIE can be expected. The small surface roughness means reducing the possibility of wasting an element area by functioning as a damaged room by the roughness, thereby leading to increase in the yield of the element.

By using, for example, carbon dioxide gas laser or YAG laser to remove the laminated film 24 on the semiconductor element 12, the silicon substrate is exposed, and at the same time the silicon surface is oxidized so as to form a silicon oxide film of 1 μmm or less in thickness at the peripheral portion of the element. By sealing with sealing resin mainly composed of epoxy, for example, injection mold, liquid epoxy or silicone resin, the adhesion strength is improved because the target to be adhered is a silicon oxide film. That is, by processing with laser and by forming a silicon oxide film on the exposed surface of the substrate 21, adhesion thereof with the resin 16 can be increased.

Further, by using laser for processing of the laminated film 24, fine roughness which cannot be obtained by ordinary mechanical grinding can be formed on the substrate surface, so that the adhesion strength between the peripheral portion of the semiconductor element 12 which is the target to be adhered and the sealing resin 16 is further improved. By increasing the adhesion strength between the peripheral portion of the element and the sealing resin, the peeling stress of the vulnerable film can be reduced. Due to these effects, the peeling of the vulnerable multi-layer low dielectric film inside the package can be securely prevented.

Furthermore, the shearing adhesion strength between mechanically processed silicon and sealing resin is 32 Mpa on average, and the peeling interface serves as an interface between the silicon and the resin. Contrary to this, when a silicon oxide film generated when the silicon surface is processed with laser is adhered with resin, despite trying to separate them, no peeling occurs on an interface between the silicon oxide film and the resin, so that the bulk silicon is destroyed. That is, the adhesion strength between the silicon oxide film and the resin reaches an adhesion strength of 37 MPa or more in bulk silicon destruction strength, which cannot be measured.

According to the embodiment, with respect to the semiconductor element 12 in which the laminated film 24 composed of a plurality of layers including the insulating film is formed on the surface of the silicon substrate 21, the laminated film 24 is removed from the periphery of the substrate by the RIE, FIB or laser, whereby the silicon substrate can be exposed to the periphery of the element. Thus, when the surface of the element is sealed with resin, the adhesion between the resin 16 and the substrate silicon is high. As a consequence, the adhesion of the resin 16 on the periphery of the element can be increased. Therefore, in the semiconductor element 12 having, for example, a vulnerable interlayer insulating film of a low dielectric constant, interlayer separation originating from stress applied to the peripheral portion of the element can be prevented, thereby improving the reliability.

Particularly, by removing the laminated film 24 on the periphery of the element with carbon dioxide gas laser or YAG laser, a silicon oxide film can be formed on the exposed substrate silicon surface, so that the adhesion with the resin can be intensified, thereby leading to a further improvement of the reliability.

Second Embodiment

Figure 7:
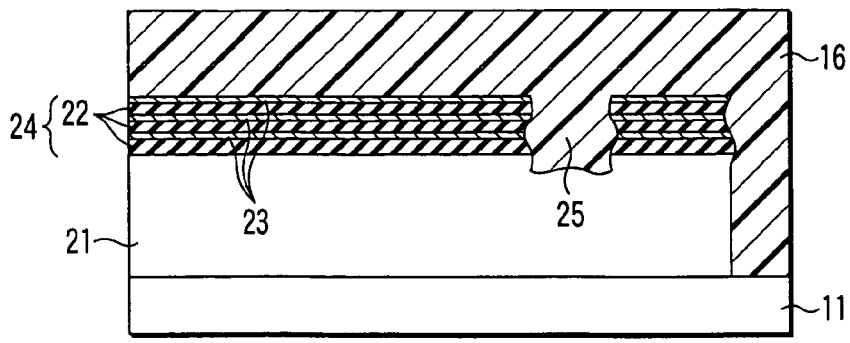
FIG. 7 is an enlarged sectional view showing a peripheral structure of a semiconductor element used in a second embodiment of the present invention.

FIG. 7 is an enlarged sectional view showing a peripheral structure of a semiconductor element used in a second embodiment of the present invention. The same reference numerals are attached to the same components as FIG. 2, and detailed description is omitted.

This embodiment is different from the first embodiment described above in that the groove 25 is formed not in the peripheral portion including the peripheral end of the semiconductor element 12, but inside from the peripheral end of the semiconductor element 12 and along the peripheral end of the semiconductor element 12.

Figure 6:
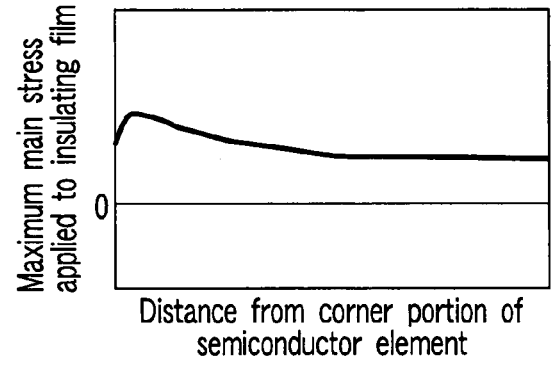
FIG. 6 is a diagram for explaining a second embodiment shown in FIG. 7, by plotting the maximum main stress applied to a laminated film depending on a distance from a peripheral end of a semiconductor element.

As processing means for the groove 25, the above-described RIE, FIB or laser beam may be employed. The formation position of the groove 25 is, for example, 10 to 300 μm inside from the peripheral end of the semiconductor element, and the width of the groove is, for example, 5 to 295 μm In this way, by forming the groove 25 inside from the peripheral end of the semiconductor element, the peripheral portion of the laminated film from which peeling occurs is departed from the high stress range of the peripheral end of the element, and at the same time, the resin 16 in the groove 25 has a high adhesion strength as described above, so that the resin 16 relaxes the stress at the peripheral end of the laminated film. The stress applied to the laminated film 24 in the embodiment is kept large at the peripheral portion of the element as shown in FIG. 6, however, since the groove 25 is formed inside from the peripheral end of the semiconductor element, the stress applied to part of the laminated film 24 that is more inside from the peripheral end than the groove 25 can be extremely reduced.

Therefore, according to the embodiment as well, the interlayer separation originating from stress applied to the peripheral portion of the semiconductor element 12 can be prevented, and the same effect as the first embodiment can be obtained. Additionally, a further effect can be obtained by using laser for forming the groove 25 like the first embodiment.

Third Embodiment

Figure 8:
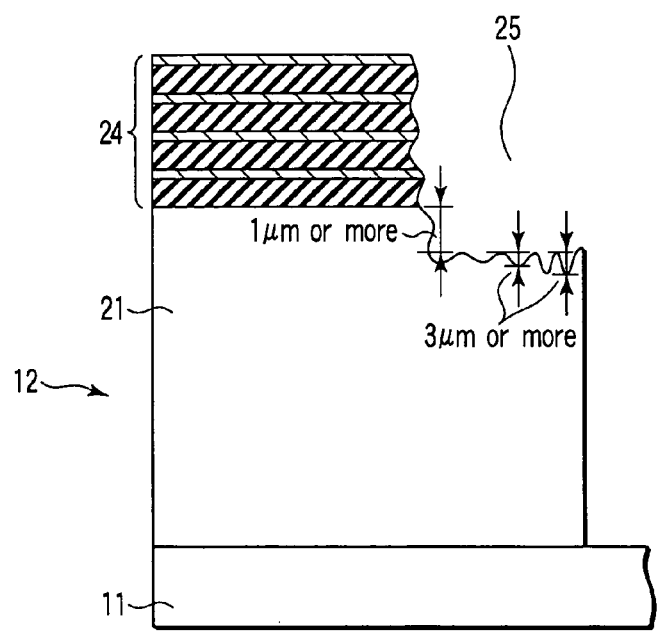
FIG. 8 is a sectional view showing a peripheral structure of a semiconductor element processed with laser according to a third embodiment of the present invention.

FIG. 8 shows a section of a peripheral structure of a semiconductor element processed with laser according to a third embodiment of the present invention.

According to this embodiment, when a groove is formed by removing the laminated film 24 including the low dielectric film on the peripheral portion including the peripheral end of the semiconductor element 102 with laser, not only the laminated film 24 including the low dielectric film is removed but also the silicon substrate is removed 1 μm or more deep from the upper surface thereof, so that the exposed surface of the silicon substrate 11 is formed 1 μm or more deep from the upper surface thereof. Since the exposed bottom surface of the silicon substrate 11 is 1 μm or more deep from the upper surface thereof, the sealing resin comes to adhere to not only the exposed bottom surface of the silicon substrate 11 but also the exposed side surface of the silicon substrate 11, so that the effective exposed area between the sealing resin and the silicon substrate 11 increases. Therefore, the adhesion strength relative to the sealing resin increases, thereby preventing peeling of the low dielectric film and peeling of the laminated film 24 including the low dielectric film. Further, the roughness of the exposed bottom surface of the silicon substrate 11, that is, the depth of unevenness of the exposed bottom surface of the silicon substrate 11 is 3 μm or larger. Since, in this way, the unevenness of 3 μm or larger is formed in the exposed bottom surface of the silicon substrate 11, the sealing resin is filled into the concave portion by an amount sufficient for exerting adhesion effect. Consequently, the adhesion strength between the silicon substrate 11 and the sealing resin increases, thereby preventing the peeling of the low dielectric film and the peeling of the laminated film 24 including the low dielectric film. For these processings with laser, for example, a third-order harmonics (355 nm) of YAG laser can be used. The laser output condition such as a laser output power and the number of output pulses of laser is determined appropriately depending on an object layer to be removed. The range of the laminated film 24 including the low dielectric film and the silicon substrate to be removed is determined from viewpoint of effective use of a semiconductor wafer in cutting out the maximum number of semiconductor chips from one semiconductor wafer and viewpoint of the minimum exposed range required for securing a desired adhesion strength between the semiconductor element and the sealing resin in each semiconductor chip. This removal range is from the peripheral end including the peripheral end of the semiconductor element 12 to 300 μm inside. Preferably, this range is from the peripheral end including the peripheral end of the semiconductor element 12 to 5 to 10 μm inside.

Further, it is preferable that the laser output when removing the laminated film 24 including the low dielectric film and the silicon substrate on the peripheral portion of the semiconductor chip differs from the laser output when removing the silicon substrate. That is, since the mechanical strength of the laminated film 24 including the low dielectric film is not so high, the film is removed with low output laser, that is, laser having an output of 1W or less so as to minimize a damage applied to the exposed surface of the laminated film 24 including the low dielectric film. On the other hand, since the silicon substrate has a high mechanical strength, the damage is small even if the substrate is removed with high output laser, for example, with laser having an output of 1W or more and can be removed up to a predetermined depth in a short time. By changing the output condition such as the laser output power and output pulse count of a laser appropriately, laser processing efficiency is improved.

Figure 9:
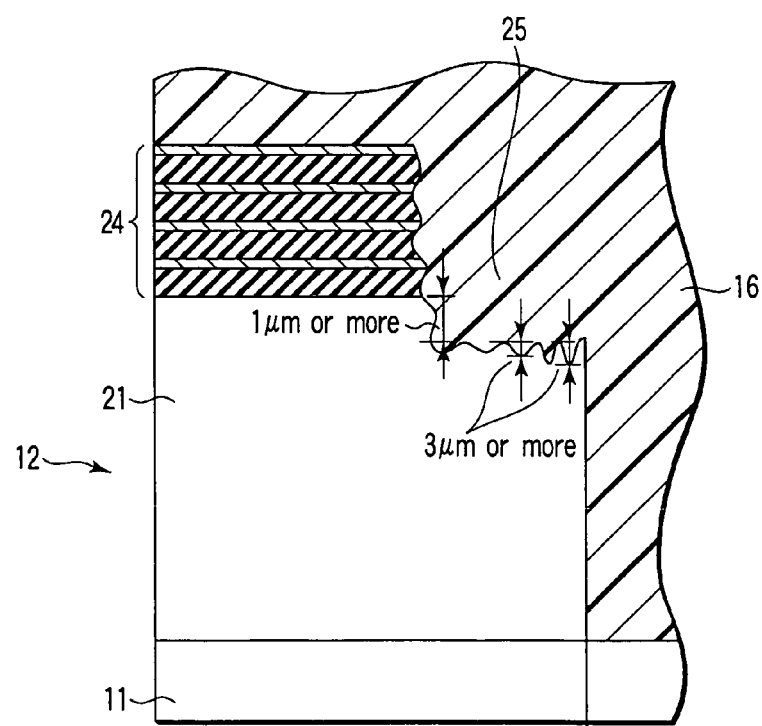
FIG. 9 is a sectional view showing the peripheral structure of the semiconductor element shown in FIG. 8, after the structure is sealed by resin.

FIG. 9 is a sectional view showing the peripheral structure of the semiconductor element shown in FIG. 8, after the structure is sealed by resin 16. This structure is substantially the same as that shown in FIG. 8 except the provision of resin 16, and thus same reference numerals are attached to the same components as in FIG. 8, and detailed description thereof is omitted.

Fourth Embodiment

Figure 10:
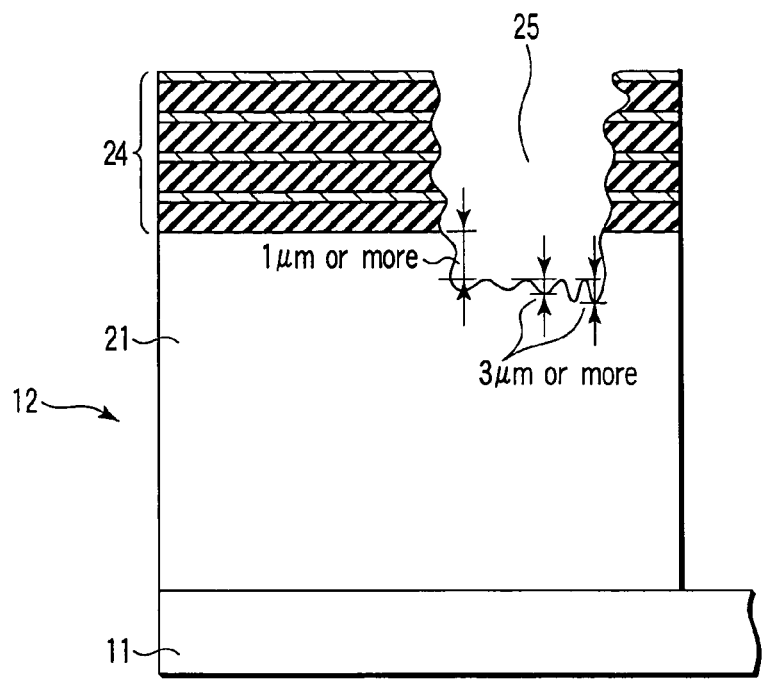
FIG. 10 is a sectional view showing a peripheral structure of a semiconductor element processed with laser according to a fourth embodiment of the present invention.

FIG. 10 is a sectional view showing a peripheral structure of a semiconductor element processed with laser according to a fourth embodiment of the present invention. Same reference numerals are attached to the same components as in FIG. 8, and detailed description thereof is omitted.

This embodiment is different from the third embodiment described above in that the groove 25 is formed not in the peripheral portion including the peripheral end of the semiconductor element 12, but inside from the peripheral end of the semiconductor element 12 and along the peripheral end of the semiconductor element 12.

The formation position of the groove 25 is, for example, 10 to 300 μm inside from the peripheral end of the semiconductor element, and the width of the groove is, for example, 5 to 295 μm In this way, by forming the groove 25 inside at a distance from the peripheral end of the semiconductor element, the peripheral portion of the laminated film from which peeling occurs is departed from the high stress range of the peripheral end of the element, and at the same time, the resin 16 in the groove 25 has a high adhesion strength as described above, so that the resin 16 relaxes the stress at the peripheral end of the laminated film. The stress applied to the laminated film 24 in the embodiment is kept large at the peripheral portion of the element, however, since the groove 25 is formed inside at a distance from the peripheral end of the semiconductor element, the stress applied to part of the laminated film 24 that is inside more distant from the peripheral end than the groove 25 can be extremely reduced.

Therefore, according to the embodiment as well, the interlayer separation originating from stress applied to the peripheral portion of the semiconductor element 12 can be prevented, and the same effect as the third embodiment as shown in FIG. 8 can be obtained. Additionally, a further effect can be obtained by using laser for forming the groove 25 like the third embodiment.

Figure 11:
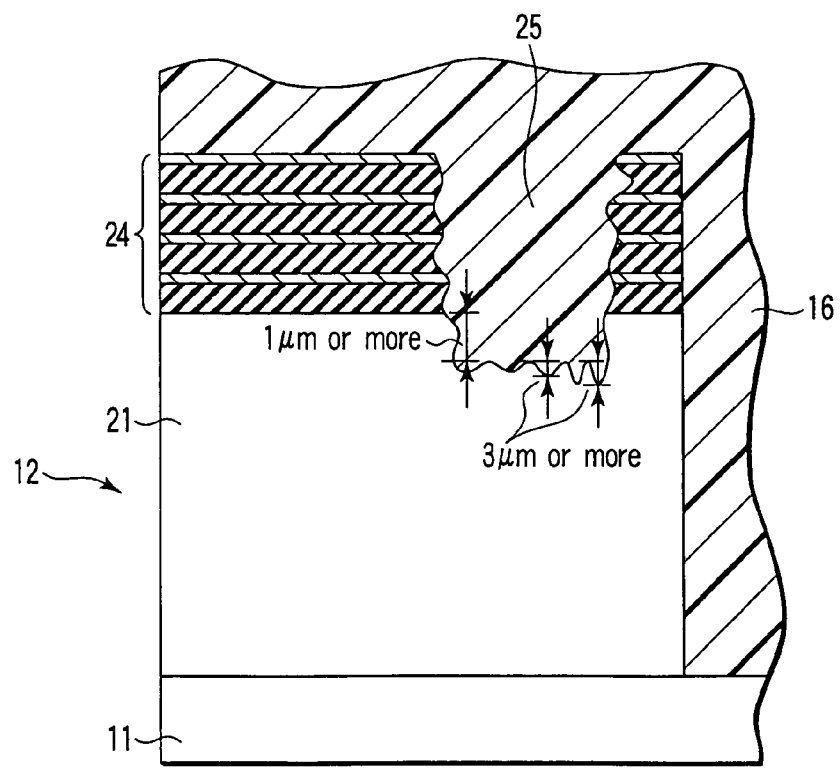
FIG. 11 is a sectional view showing the peripheral structure of the semiconductor element shown in FIG. 10, after the structure is sealed by resin.

FIG. 11 is a sectional view showing the peripheral structure of the semiconductor element shown in FIG. 10, after the structure is sealed by resin 16. This structure is substantially the same as that shown in FIG. 10 except the provision of resin 16, and thus same reference numerals are attached to the same components as in FIG. 10, and detailed description thereof is omitted.

Fifth Embodiment

Figure 12:
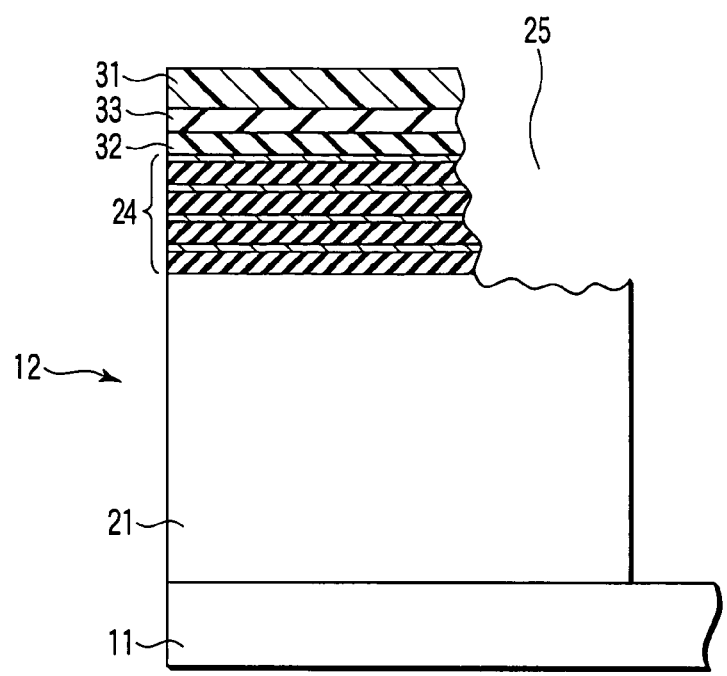
FIG. 12 is a sectional view showing a peripheral structure of a semiconductor element processed with laser according to a fifth embodiment of the present invention.

FIG. 12 shows a section of a peripheral structure of a semiconductor element processed with laser according to a fifth embodiment of the present invention.

When the silicon substrate 21 is exposed by removing the laminated film 24 including the low dielectric film on the peripheral portion including the peripheral end of the semiconductor element 12 and the silicon substrate with laser, the silicon components of the laminated film 24 including the low dielectric film and the silicon substrate are scattered due to application of laser. If the scattered silicon components adhere to a pattern wiring portion formed on the silicon substrate, a short-circuit is generated between wires, whereby leading to a defective element. Thus, as shown in FIG. 12, a surface protecting film (an adhering preventing film) 31 is provided in order to prevent adhering of the scattered silicon components to the pattern wiring portion formed on the silicon substrate and thus to prevent generation of the short-circuit between the wiring patterns. The surface protecting film is a film whose refractivity n is larger than 1.5 (n>1.5) when the refractivity n is measured by an elepso meter using light beam having the wavelength of 365 nm in order to form a groove by using a third-order harmonics (355 nm) of YAG laser. The surface protecting film is made of PVA (polyvinyl alcohol), for example.

Since the surface protecting film is provided on the laminated film 24 including the low dielectric film, the silicon components, which are scattered when removing the laminated film 24 including the low dielectric film and the silicon substrate on the peripheral portion including the peripheral end of the semiconductor element 12 with laser, adhere to the surface protecting film 31, whereby adhering of the silicon components to the pattern wiring portion is prevented. PVA has a good absorption characteristic when applied with laser, and thus it has a high efficiency of heat generation. Thus, the temperatures of the laminated film 24 including the low dielectric film and the silicon substrate increases when applied with laser, with the result of accelerating the removal of the laminated film 24 including the low dielectric film and the silicon substrate. Generally, the surface protecting film 31 is removed together with the scattered silicon components with laser after the groove is provided. Water cleaning or chemical solution cleaning is generally used to remove the surface protecting film 31.

Further, when, as shown in FIG. 12, an insulating film 32 having a refractivity of 1.5 or less, for example, TEOS having a refractivity of 1.49 is formed at a lower layer between the laminated film 24 including the low dielectric film and the surface protecting film 31, and an insulating film 33 having a refractivity of larger than 1.5, for example, polyimide having a refractivity of 1.5 to 1.8 is formed at an upper layer, processing efficiency when forming a groove in the low dielectric film with laser is accelerated. The reason is that if the refractivity of the upper layer films (the surface protecting film and insulating film having a refractivity larger than 1.5) 31 and 33 is larger than the refractivity of the lower layer film (the insulating film having the refractivity of 1.5 or less) 32, not only the absorbability of the upper layer films 31 and 33 to laser is intensified but also progress in heat processing of the laminated film 24 including the low dielectric film by heating with laser can be expected. Further, another reason is that if the upper layer films (the surface protecting film and insulating film having the refractivity larger than 1.50) 31 and 33 are processed so that a removed portion is produced, the deleted portion functions just like an open lid and gas generated when processing the lower layer film is discharged outside effectively, thereby preventing the laminated film 24 from being damaged by the gas pressure. In the meantime, if the insulating film 33 having the refractivity larger than 1.50, for example, polyimide having the refractivity of 1.5 to 1.8 is formed between the laminated film 24 including the low dielectric film and the surface protecting film 31, there is not only an effect of functioning as the surface protecting film but also an effect of accelerating heat processing on the laminated film 24 including the low dielectric film as described above.

Figure 13:
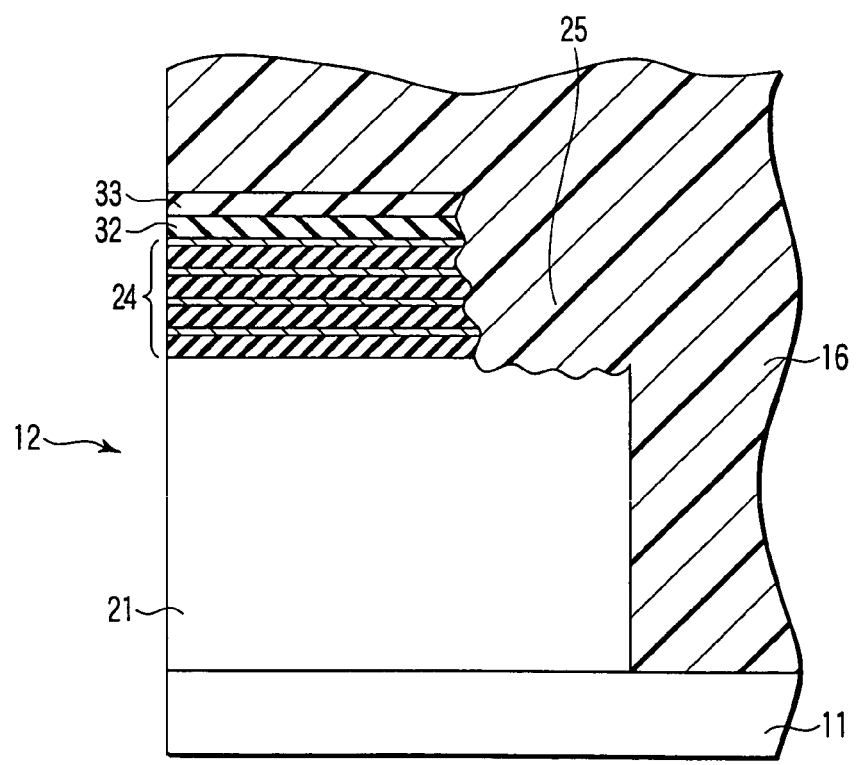
FIG. 13 is a sectional view showing the peripheral structure of the semiconductor element shown in FIG. 12, after the surface protecting film is removed and the structure is sealed by resin.

FIG. 13 is a sectional view showing the peripheral structure of the semiconductor element shown in FIG. 12, after the surface protecting film 31 is removed and the structure is sealed by resin 16. This structure is substantially the same as that shown in FIG. 12 except the removal of the surface protecting film 31 and the provision of resin 16, and thus same reference numerals are attached to the same components as in FIG. 12, and detailed description thereof is omitted.

Six Embodiment

FIG. 14 is a sectional view showing a peripheral structure of a semiconductor element processed with laser according to a sixth embodiment of the present invention.

This embodiment is different from the fifth embodiment described above in that the groove 25 is formed not in the peripheral portion including the peripheral end of the semiconductor element 12, but inside from the peripheral end of the semiconductor element 12 and along the peripheral end of the semiconductor element 12. Thus, same reference numerals are attached to the same components as in FIG. 12, and detailed description thereof is omitted.

FIG. 15 is a sectional view showing the peripheral structure of the semiconductor element shown in FIG. 14, after the surface protecting film 31 is removed and the structure is sealed by resin 16. This structure is substantially the same as that shown in FIG. 14 except the removal of the surface protecting film 31 and the provision of resin 16, and thus same reference numerals are attached to the same components as in FIG. 14, and detailed description thereof is omitted.

MODIFICATION

Figure 16:
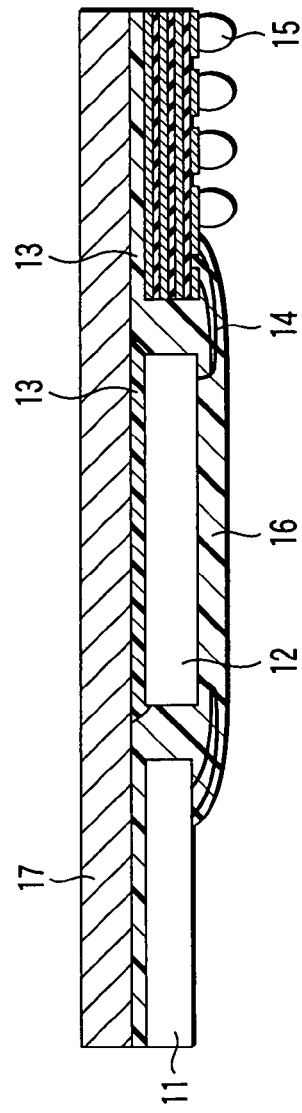
FIG. 16 is a sectional view for explaining a modification of the embodiments according to the present invention, in which the semiconductor element is arranged into an E-BGA type mounting structure.
Figure 17:
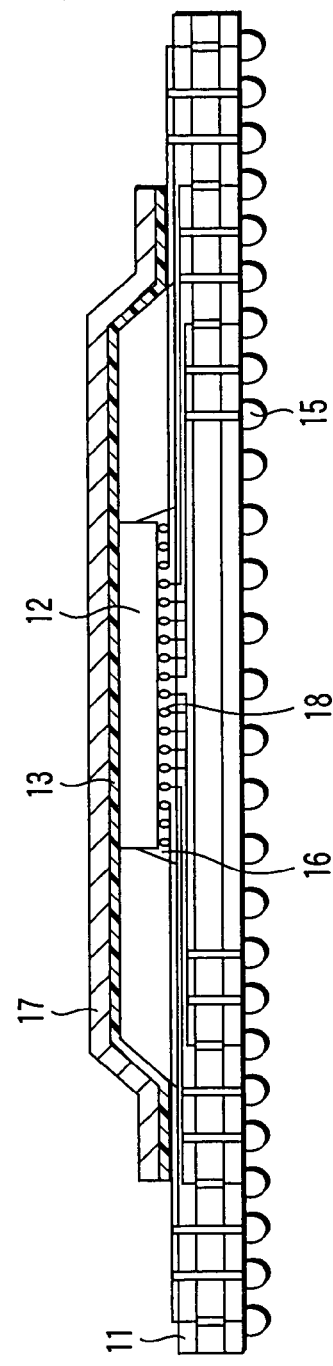
FIG. 17 is a sectional view for explaining another modification of the embodiments according to the present invention, in which the semiconductor element is arranged into an FC-BGA type mounting structure.
Figure 18:
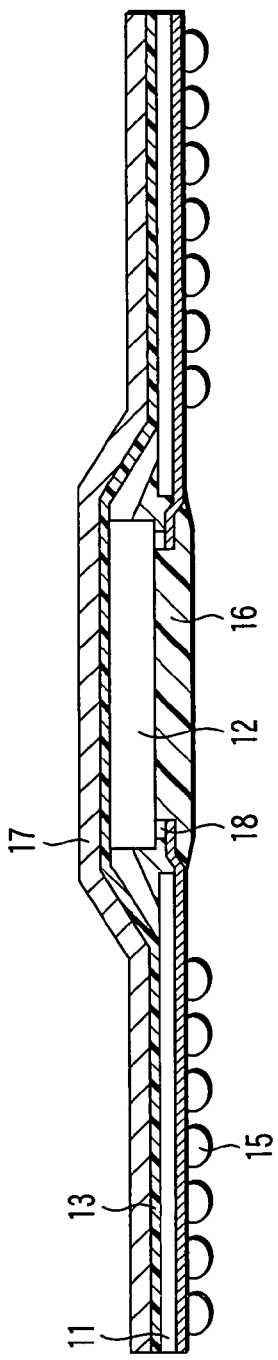
FIG. 18 is a sectional view for explaining a further modification of the embodiments according to the present invention, in which the semiconductor element is arranged into a T-BGA type mounting structure.

The present invention is not restricted to the above-described embodiments. Although in the above embodiments, an example of P-BAG package has been described, the present invention is not restricted to this example, but it may be applied to other types of packages, for example, an E-BGA package shown in FIG. 16, an FC-BGA package shown in FIG. 17, and a T-BGA package shown in FIG. 18. Same reference numerals are used to designate the same components as FIG. 1, and reference numeral 17 denotes a stiffener and reference numeral 18 denotes a bump. The present invention can also be applied to further types of packages as long as the surface side of the semiconductor element or the entire semiconductor element is sealed with resin.

The removal of the peripheral portion of the laminated film or processing of the groove is carried out on the entire periphery of the semiconductor element according to the embodiments. However, it is not necessary to carry out removal or processing on the entire periphery. It is effective to apply the removal or processing to only a corner portion of a semiconductor element having a high thermal stress applied to the semiconductor element inside the package. In an area having a high thermal stress between the sealing resin and the silicon substrate, the laminated film only need to be removed continuously at least 500 µm or more along the dicing line.

The substrate is not always restricted to silicon but it is permissible to use GaAs or other semiconductor substrates. Further, the sealing resin is not restricted to epoxy-base or silicone-base, but other resins may be used as long as the resins are capable of having sufficient adhesion with the semiconductor substrate or the oxide film thereof.

According to the embodiments of the present invention, the laminated film on the peripheral portion of the semiconductor element is removed to expose the substrate surface on the peripheral portion of the element, whereby the peripheral portion of the element can be formed of a semiconductor made of silicon or the like or the oxide film thereof, so that the adhesion strength with the sealing resin can be intensified. Therefore, even if stress is applied to the peripheral portion on the surface of the element when the surface side of the semiconductor element is sealed with resin, no peeling of the resin occurs, thereby preventing the internal insulating layer from being peeled, and accordingly, the reliability of the semiconductor element can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor element in which a laminated film composed of a plurality of layers including an insulating film is formed on a surface of a semiconductor substrate, and a portion, the exposed portion of the substrate being roughened or partially removed of the laminated film is removed from the surface of the semiconductor substrate so that a portion of the semiconductor substrate is exposed at the portion;
   a mounting substrate on which the semiconductor element is mounted; and
   a resin layer which seals at least a surface side of the semiconductor element with resin and covers the exposed portion of the substrate.

2. A semiconductor device according to claim 1, wherein the exposed portion of the substrate is a portion of a peripheral portion of the substrate including a peripheral end thereof.

3. A semiconductor device according to claim 1, wherein the exposed portion of the substrate is a portion along a peripheral end of the substrate and inside at a distance from the peripheral end.

4. A semiconductor device according to claim 1, wherein an exposed surface of the laminated film and the exposed surface of the substrate created by the removal of the portion of the laminated film have a surface roughness of 1 µm or less.

5. A semiconductor device according to claim 1, wherein an oxide film is formed on the exposed portion of the semiconductor substrate.

6. A semiconductor device according to claim 1, wherein a width of the removed portion of the laminated film is 1 to 300 µm.

7. A semiconductor device according to claim 6, wherein the width of the removed portion of the laminated film is 5 to 10 µm.

8. A semiconductor device according to claim 1, wherein the exposed portion of the substrate is removed 1 µm or more deep from the surface of the substrate.

9. A semiconductor device according to claim 1, wherein the exposed portion of the substrate has a surface roughness of 3 µm or larger.

10. A semiconductor device according to claim 1, wherein a film having refractivity larger than 1.5 when measured with an elepso meter using light beam having wavelength of 365 nm is provided above the laminated film.

11. A semiconductor device according to claim 10, wherein the film having refractivity larger than 1.5 is a protecting film for preventing of adhering of semiconductor components scattered when the laminated film is removed.

12. A semiconductor device according to claim 11, wherein an insulating film having refractivity of 1.5 or less when measured with an elepso meter using light beam having wavelength of 365 nm is formed at a lower layer between the protecting film and the laminated film, and an insulating film having refractivity larger than 1.5 is formed at an upper layer between the protecting film and the laminated film.

* * * * *

UNITED STATES PATENT AND TRADEMARK OFFICE
CERTIFICATE OF CORRECTION

| | |
|---|---|
| PATENT NO. | : 7,202,563 B2 |
| APPLICATION NO. | : 11/088879 |
| DATED | : April 10, 2007 |
| INVENTOR(S) | : Imoto et al. |

It is certified that error appears in the above-identified patent and that said Letters Patent is hereby corrected as shown below:

Claim 1, column 11, lines 41-49, delete first paragraph of claim 1 and insert therefor:

--1. A semiconductor device comprising:

a semiconductor element in which a laminated film composed of a plurality of layers including an insulating film is formed on a surface of a semiconductor substrate, and a portion of the laminated film is removed from the surface of the semiconductor substrate so that a portion of the semiconductor substrate is exposed at the removed portion, the exposed portion of the substrate being roughened or partially removed;--.

Signed and Sealed this

Twenty-sixth Day of June, 2007

JON W. DUDAS
*Director of the United States Patent and Trademark Office*